United States Patent [19]

Natter

[11] Patent Number: 5,174,843

[45] Date of Patent: Dec. 29, 1992

[54] MATRIX SUPPORT ARTICLE SHAPING SYSTEM AND METHOD

[75] Inventor: Marc D. Natter, Yonkers, N.Y.

[73] Assignee: Honatech, Inc., Yonkers, N.Y.

[21] Appl. No.: 312,613

[22] Filed: Feb. 17, 1989

[51] Int. Cl.$^5$ .................................. B32B 31/00
[52] U.S. Cl. ............................ 156/155; 156/182;
156/222; 156/273.5; 156/273.7; 156/275.5;
156/307.1; 156/309.6; 156/379.8; 156/380.9;
156/543; 156/558; 156/563
[58] Field of Search ............... 156/273.3, 273.5, 273.7,
156/275.1, 275.5, 379.8, 380.9, 58, 89, 312,
309.6, 307.1, 155, 543, 558, 563, 222, 182;
264/22; 430/270, 271, 273, 296, 325, 320, 321;
425/174, 174.4; 364/474.5, 474.8, 477

[56] References Cited

U.S. PATENT DOCUMENTS

| | | | |
|---|---|---|---|
| 2,760,863 | 8/1956 | Plambeck | 430/271 X |
| 2,936,261 | 5/1960 | Cole | 264/22 |
| 3,322,587 | 5/1987 | Burnet | 156/216 |
| 3,608,046 | 9/1971 | Philips | 264/221 |
| 4,137,081 | 1/1979 | Pohl | 96/87 R |
| 4,228,232 | 10/1980 | Rousseau | 430/271 |
| 4,387,000 | 6/1983 | Tancredi | 156/495 |
| 4,447,488 | 5/1984 | Simm et al. | 428/217 |
| 4,575,330 | 3/1986 | Hull | 156/58 |
| 4,752,352 | 6/1988 | Feygin | 156/272.8 |
| 4,752,498 | 6/1988 | Fudim | 264/22 |
| 4,863,538 | 9/1989 | Deckard | 156/62.2 |
| 4,961,154 | 10/1990 | Pomerantz et al. | 264/22 X |

FOREIGN PATENT DOCUMENTS 0250121 12/1987 European Pat. Off. .
61-145058 7/1986 Japan ................................ 156/505

OTHER PUBLICATIONS

Dycril Printing Plates, E. I. Dupont Sep. 1964 pp. 1–1 and VII-I through VII-14.
Fudim, E. V., "Sculpting Parts with Light" Mar. 6, 1986, *Machine Design*, pp. 102–106.
The Photoengravers Bulletin, Nov. 1964 pp. 83–90.
Celeste, J. R., "Unique Properties and Uses of Photopolymer Film Resists", *Applications of Photopolymers*, 1970, pp. 42–43.

*Primary Examiner*—David A. Simmons
*Assistant Examiner*—Chester T. Barry
*Attorney, Agent, or Firm*—Natter & Natter

[57] ABSTRACT

A system for forming an article includes an apparatus for stacking successive sheets of a polymer mixture and selectively irradiating each sheet with an electron beam deflected to trace the configuraiton of an incremental heighth of the article. The polymer mixture may include a polymer resin mixed with a reactive diluent and, if required, an initiator. The stacked sheets form a matrix which supports the article as it is being shaped. After integration of all incremental heighths of the article, heat or chemical dissolution is employed to remove the matrix. The sheets may be a laminate of a stratum bonded to a substratum. The substratum is easily compressed under heat to reference the level of the upper surface of the sheet irrespective of thickness variations of the sheet. To compensate for beam intensity absorption, the substratum is formulated with increased sensitivity. Successive sheets are heated while being transported to a platen which is positioned beneath an electron gun. Roller pressure is then applied to compress the heat softened substratum and reference the upper face of the stratum. The electron beam is then activated. Thereafter, the next successive sheet is heated, positioned, referenced and irradiated.

30 Claims, 4 Drawing Sheets

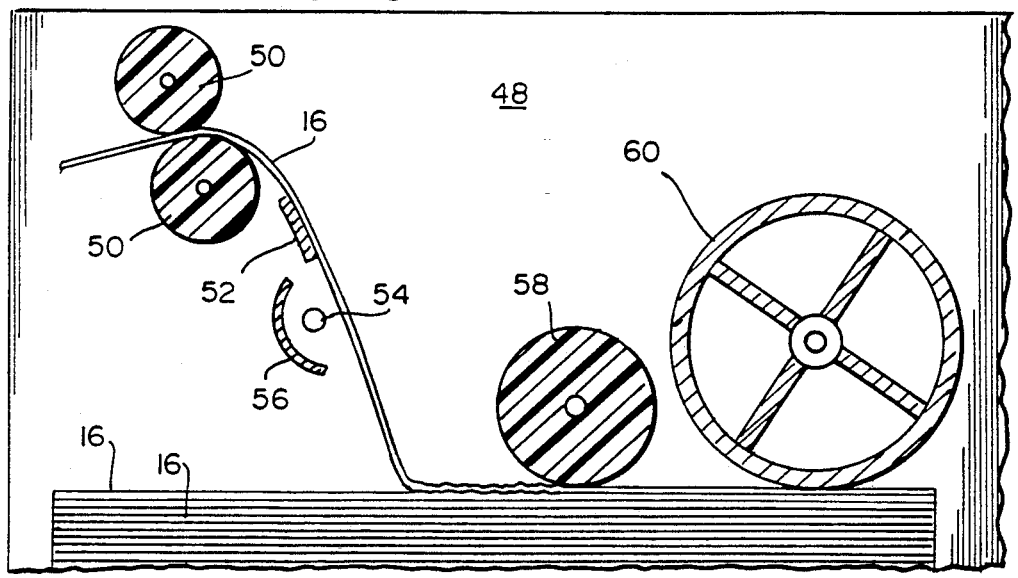
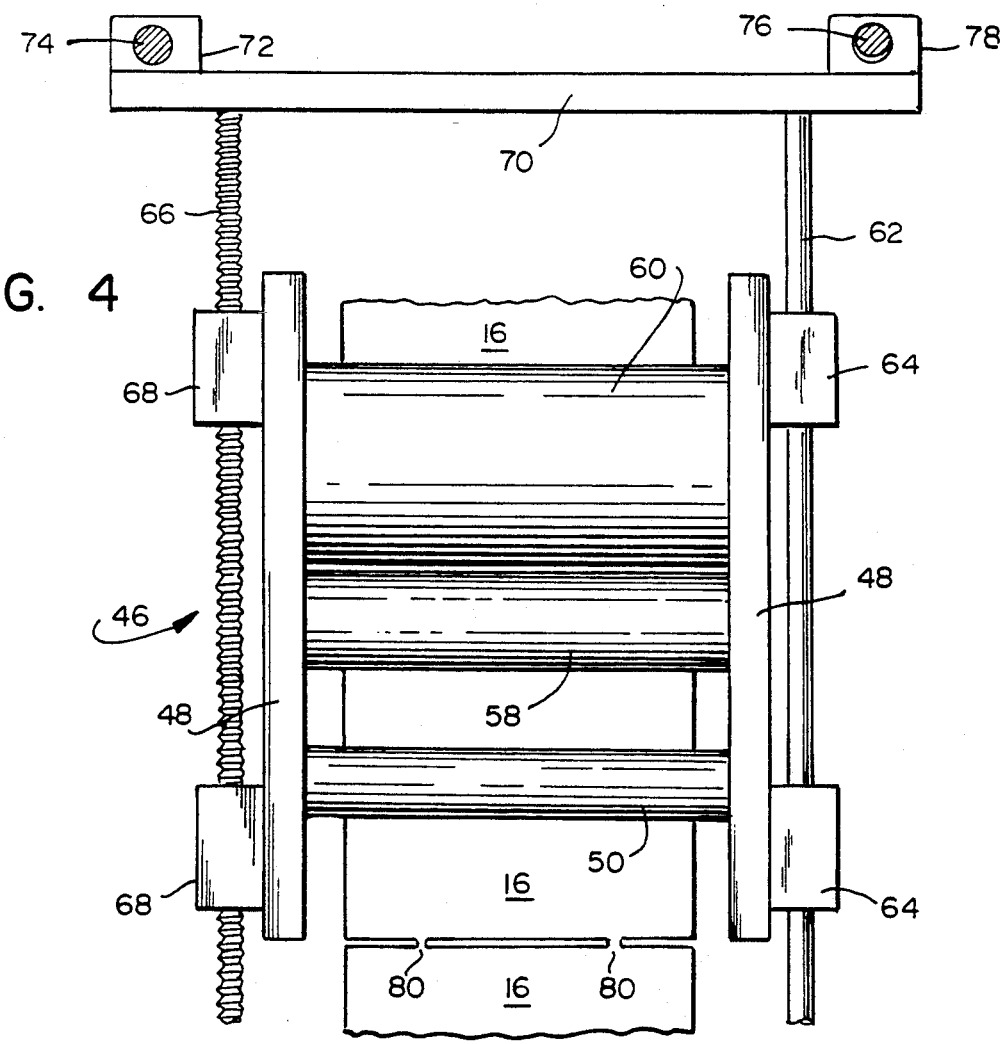

MATRIX SUPPORT ARTICLE SHAPING SYSTEM AND METHOD

BACKGROUND OF THE INVENTION

1. Field of the Invention

This invention relates generally to the formation of an article prototype or model from a mathematical description and more particularly to a system for generating the shape of an article by irradiating successive sheets which comprise a matrix which supports the article during formation.

2. Background Art

Since the implementation of computer technology for physical design purposes, the need for expanding use of computers to control the fabrication of prototypes of articles which have been designed has been appreciated. While the principle of irradiating an article to effect changes in molecular structure and physical properties has been long recognized, such phenomenon had not been employed for the purpose of generating three-dimensional articles until recent years. In this regard, attempts have been made to utilize a fluid medium containing a curable material which was irradiated by a plurality of beams. The energy level at the intersection of the beams was sufficient to cure the material within the fluid medium. Such apparatus did not gain widespread acceptance due to many inherent disadvantages including cost, resolution difficulties and insufficient energy levels as a result of absorption as the depth of beam penetration into the fluid medium increased.

In patent 4,575,330, an apparatus for constructing an article by ultra violet irradiation of the upper surface of a photopolymeric fluid medium was disclosed. Successive layers of an article were generated by lowering each polymerized layer into the fluid medium so that the upper surface of the fluid medium contained unpolymerized material suitable for polymerization and generation of the next layer.

While the apparatus did not require multiple beams, it suffered from several disadvantages. It was limited to use with ultra violet beams and required photopolymers responsive to the ultra violet wavelengths. In addition, difficulties were encountered in maintaining the upper surface of the fluid medium at a planar reference level due to fluid turbulence, reduction in fluid level as a result of the polymerization of prior layers and uneven shrinkage of the polymerized material. Also, the apparatus lacked precise control over the depth of polymerization into the fluid medium which resulted in loss of axial resolution.

Further, because a fluid medium was used, the article being constructed could not be supported by the fluid medium and a support platform, moveable within the medium was required. As such, articles having surfaces contoured with undercuts and the like could not be generated without providing a complicated mechanism capable of moving the platform along multiple axes.

SUMMARY OF THE INVENTION

In compendium, the present invention comprises a system for constructing three dimensional articles utilizing a computer. Sheets of a thermoplastic polymer mixture are stacked on a platen and each sheet is irradiated with an electron beam which is deflected to trace the configuration of an incremental planar heighth of the article. The beam effects cross-linking of the polymer in areas impinged to convert, for example, a thermoplastic to a thermoset. The successive sheets are stacked on top of one another and form a matrix which supports the built up configuration of the article. The thermoplastic matrix is removed by heat and/or solvents which do not affect the cross-linked polymer.

The thermoplastic polymer mixture comprises two basic components, a base polymer resin and a reactive diluent. Although the components are functionally distinct they are not necessarily physically distinct.

Individual sheets may be formed of a first layer or stratum and a readily compressible substratum which is bonded to the stratum to form a composite sheet. The substratum serves the function of compensating for cumulative differences in the thickness of each sheet, within tolerance limits, to assure a planar reference level of the face of the uppermost sheet being irradiated. The total thickness of each sheet, within tolerance levels, is initially at least as great as the incremental article heighth to be generated and the substratum is plastically deformed under heat to establish a planar reference level of each sheet and conform the sheet thickness to the incremental article heighth.

The substratum may also comprise a thermoplastic with increased cross-linking sensitivity to compensate for the decrease in beam intensity resulting from absorption in the stratum. Also a plurality of substrata of increasing cross-linking sensitivity may be employed.

An apparatus for forming articles includes an electron gun assembly, a platen positioned beneath the gun and a mechanism for feeding sheets to compile a stack supported by the platen. Successive sheets are heated while being fed to the stack and the heated sheets are referenced by roller pressure which compresses the substratum. Thereafter, the electron gun is activated to trace the electron beam over the sheet.

The configuration traced by the electron beam on each sheet comprises the configuration of the article at its incremental heighth which conforms to such sheet. The electron beam effects a cross-linking of the sheet polymer to generate the shape of the article in transformed polymer surrounded by the remaining, nonirradiated portions of the sheets. After the last sheet has been irradiated, the matrix is removed from the article by heat, pressure and/or chemical dissolution.

From the foregoing, it will be appreciated that it is an aspect of the present invention to provide an article shaping system of the general character described which is not subject to the disadvantages of the background art aforementioned.

A feature of the present invention is to provide an article shaping system of the general character described capable of constructing three-dimensional prototypes of computer designed articles with precise dimensional accuracy.

A consideration of the present invention is to provide an article shaping system of the general character described which does not require complex mechanical structures or multiple irradiation beams to form intricate shapes.

It is another consideration of the present invention to provide an article shaping system of the general character described wherein the article to be formed may be selected from a wide variety of materials having different physical properties.

Another feature of the present invention is to provide an article shaping system of the general character described capable of generating a three-dimensional article with contour surfaces having fine definition.

To provide an article shaping system of the general character described capable of producing intricate shapes while moving the article in only a single plane is a further aspect of the present invention.

Providing a computer controlled article shaping system which is simple to use is another aspect of the present invention.

A further consideration of the present invention is to provide an article shaping system of the general character described which utilizes a reactive energy beam for configuring an article shape in successive sheets of a built up support matrix.

Another feature of the present invention is to provide an article shaping system of the general character described which utilizes a beam for configuring an article shape on successive sheets of a supporting matrix while minimizing beam penetration to underlying sheets.

A still further feature of the present invention is to provide a method of the general character described for shaping an article whereby a configuration of the article is generated by cross-linking areas of sheets which are stacked to provide a support matrix for the article as its shape is being generated.

Other aspects, features and considerations in part will be obvious and in part will be pointed out hereinafter.

With these aims in view, the invention finds embodiment in certain combinations of elements, arrangements of parts and series of steps by which the said aspects, features and considerations and certain other aspects, features and considerations are attained, all with reference to the accompanying drawings and the scope of which is more particularly pointed out and indicated in the appended claims.

BRIEF DESCRIPTION OF THE DRAWINGS

In the accompanying drawings in which are shown some of the various possible exemplary embodiments of the invention:

FIG. 3 is an enlarged scale longitudinal sectional view through the transport carriage, with portions deleted for clarity, and illustrating the positioning and referencing of a sheet of the stack;

FIG. 4 is a plan view of the carriage and showing a plurality of linear bearings for facilitating both vertical and horizontal translational movement of the carriage;

DESCRIPTION OF THE PREFERRED EMBODIMENT

Figure 1:
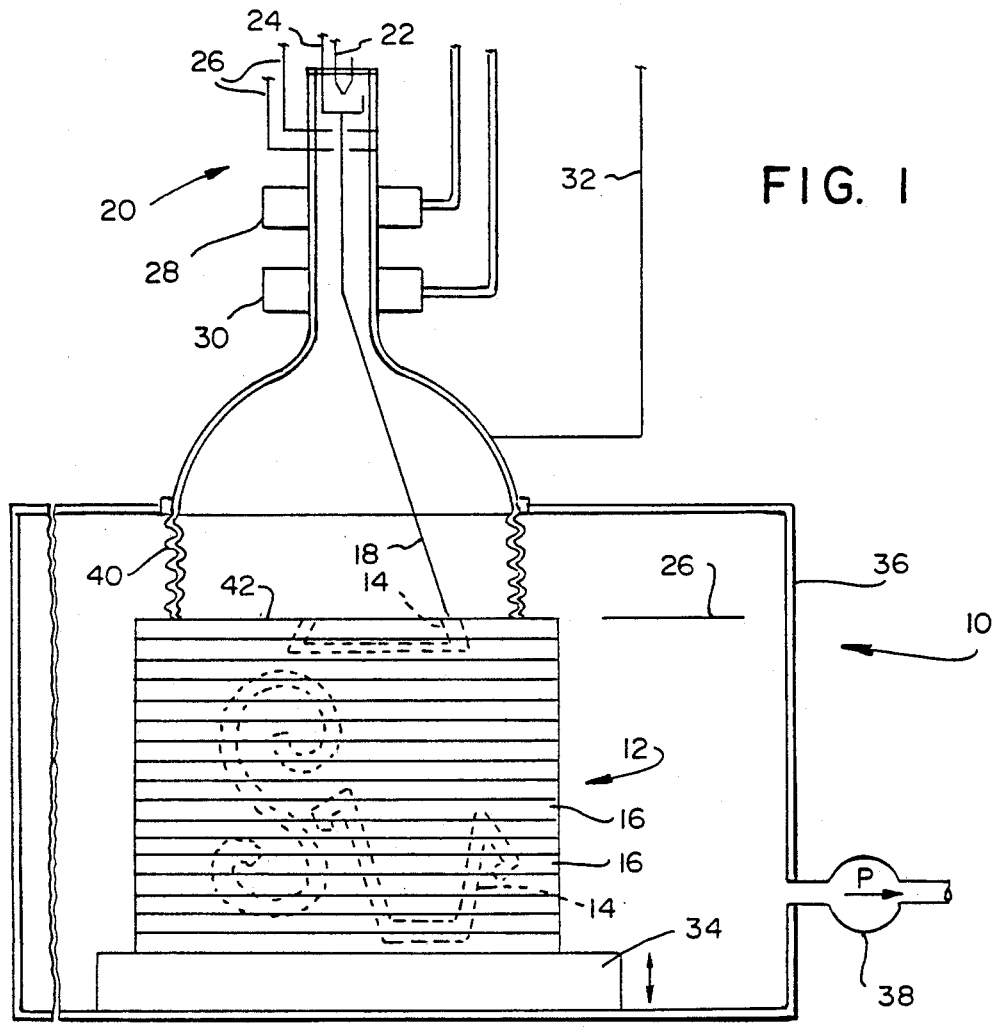
FIG. 1 is a schematized simplified diagram of a matrix support article shaping system in accordance with the present invention with portions deleted for clarity and showing an electron beam generating apparatus positioned above a matrix which comprises a stack of thermoplastic sheets and also showing an electron beam tracing an incremental heighth of an article in the uppermost sheet of the stack.

Referring now in detail to the drawings, the reference numeral 10 denotes generally a matrix support article shaping system constructed in accordance with an embodying invention. The system 10 includes a matrix 12 which provides a medium for carrying the form of an article or articles 14 which are incrementally generated on individual sheets 16 of thermoplastic polymer. The thickness of each sheet 16 corresponds to an incremental height of the article or articles 14 being formed.

Pursuant to the invention, each sheet 16 is irradiated at an impingement station with a reactive energy beam, such as an electron beam, which is deflected to trace the configuration of an incremental planar height of the article with the uppermost sheet of a stack being irradiated and thereafter successive sheets being applied over the irradiated sheet.

Accordingly, the apparatus 10 includes a device for generating and deflecting an electron beam 18 to trace the configuration of the article 14 at each incremental height. Such beam generating and deflecting apparatus may comprise an electron gun 20 having a filament heater 22, a cathode 24, grids 26, a focusing coil 28, a deflection coil 30 and an anode connection 32.

The electron gun 20 may have a fixed focus at a reference plane 25 and if so, the stack of sheets 16 forming the matrix 12 is carried on a platen 34 having a vertical translation mechanism for positioning the top surface of the uppermost of each of the successive sheets 16 coincident with a fixed reference plane 25. Since the sheets are dimensionally stable, the platen 34 does not require lateral containment such as walls or other lateral support means. Alternately, the focal length of the beam may be reduced after each sheet is placed on the stack and the reference plane 25 will change for each sheet.

It should be appreciated that the thickness of the sheets 16 is disproportionately enlarged in FIG. 1 and the thickness of typical sheets would be actually on the order of between, for example 0.0005 inch to 0.020 inch.

It should also be appreciated that to reduce energy loss and maintain a large mean free path of the electrons relative to the dimensions of the apparatus, the environment of the electron gun 20 and the sheets 16 of the matrix should be under vacuum, i.e. reduced pressure. For this purpose, the entire apparatus is encased in an air tight housing 36 and an evacuation pump 38 is employed. Further, a flexible bellows 40 having a base plate 42 may be provided to assure increased vacuum with reduced energy loss over the major course of electron beam travel.

In accordance with the invention, the article or articles 14 are formed or shaped by irradiating each successive uppermost sheet 16 with a reactive beam deflected to trace the configuration of an incremental height of the article or articles. The sheets 16 preferably comprise a solid thermoplastic which may be selectively changed from or into a thermoset. As is well known in the industry, thermoplastic materials become pliable and often melt under the influence of heat but regain their properties when cooled. Thermosets, on the other hand, retain their physical properties under the influence of heat until a temperature at which permanent degradation occurs. It is the molecular structure of the polymer which determines the properties which lead to such effects and whether a polymer is denoted a thermoplastic or thermoset.

Thermoplastics are characterized as highly intertwined chains of molecules of various lengths bonded unidimensionally. That is, the molecules are arranged in repeating units called mers, hence polymers, which are bonded in a linear branched chain structure. The structure may nevertheless slip and/or rotate with respect to other chains under the action of heat, pressure or solvents. Thermosets are arrangements of polymers in a three dimensional network structure wherein the chains are strongly bonded to each other such that relative motion of the chains only results in the destruction of the network bonds.

The present invention utilizes the principle that if a thermoset object is formed in and surrounded by a thermoplastic matrix, the matrix can be removed by heat, pressure and/or solvents or a combination thereof without affecting the thermoset object. The reactive beam may comprise electromagnetic radiation or accelerated particles which impinge on the sheet to cause a change in structure such that if the sheet comprises a thermoplastic, the beam causes bonding or cross-linking of the linear chains into a network structure, i.e. thermoset. Conversely, if a thermoset sheet is employed, the beam would act to selectively degrade portions thereof for subsequent removal without affecting the nonirradiated regions.

The polymer chosen for the sheets 16 which comprise the matrix 12 consists of a base resin, a reactive diluent and, if necessary, an initiator. These functional entities may or may not be physically distinct. The base resin is present in greater proportion than the other constituents and forms the backbone of the mixture while the reactive diluent provides a source of bond forming or bond breaking molecules which are released by the action of the energy beam or by stimulation of the initiator.

The particular composition of the matrix polymer mixtures is tailored to the reactive beam and sensitivity desired as well as to the desired physical properties of the article. By employing a beam of ultra violet radiation from a laser or other conventional source, an initiator whose absorption spectrum coincides with the wave length of the beam must be chosen. The initiator could then cause the reactive diluent to break into free radicals, whose presence would break or form bonds in the base resin according to the specific resins and radicals.

Since it is difficult to match these constituents for optimal properties under stimulation from existing ultra violet light sources, due the relatively low reaction energies obtainable, in the preferred form of the invention, higher reaction energies are attained through the use of an electron beam rather than an ultra violet light source. As a result, the matrix mixture may be more readily tailored to obtain satisfactory physical rather than reactive properties. Further, mixture toxicity can be reduced and reactive sensitivity can be easily controlled through selection of appropriate reactive diluents and initiators and their respective concentrations.

Typical examples of base resins and reactive diluents suitable for employment in the present invention are set forth in the table below.

| Base Resins | Reactive Diluents |
| --- | --- |
| Polyvinyl alcohol | Dialdehydes |
| Polyethylene | Organic Peroxides (Dicumyl Peroxide) |
| Phenoxy | Diisocyanates. Triazines, Melamines |
| Diallyl phthallate | Organic Peroxides Speed Reaction if desired |

Figure 2:
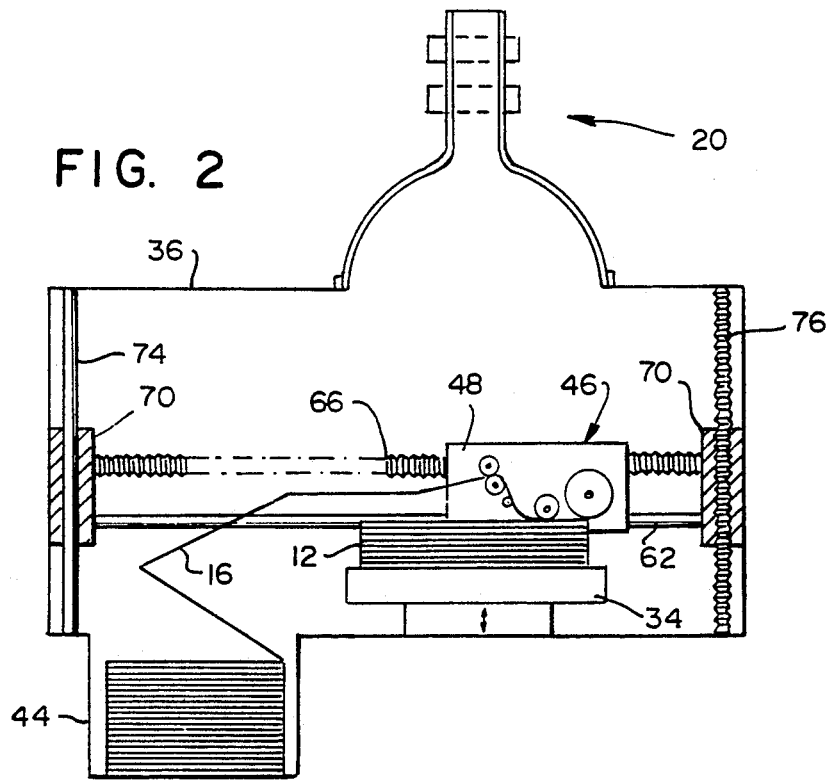
FIG. 2 is a longitudinal sectional view through the matrix support article shaping system, with portions deleted for clarity, and showing a supply of thermoplastic sheets, a matrix comprising a stack of sheets positioned on a platen and a transport carriage for feeding, heating, positioning and referencing each sheet and for fusing each sheet to its underlying sheet.

Referring now to FIG. 2, wherein there is shown a mechanism for feeding and placement of successive sheets 16, it will be seen that the housing 36 includes a well or other suitable compartment, i.e., a layered plurality, 44 for carrying a supply of sheets 16 in a fan folded orientation. The sheets extend from the supply to a carriage 46. The carriage comprises a pair of opposed parallel walls 48 between which are mounted a pair of sheet engaging friction feed rollers 50, at least one sheet guide 52, a heating element 54 which may comprise a quartz tube, a heat reflector 56, a first spring loaded contact roller 58 which engages the heat softened sheet 16 and a referenceing roller 60 which functions to sequentially place the face of successive transported sheets substantially in a reference plane and serves to assure accurate placement and positioning of the plane of the upper surface of each sheet coincident with the reference plane 25. The rollers 58, 60 may be geared together for simultaneous rotation.

The carriage is mounted for reciprocal movement along a horizontal plane with the surface of the referencing roller 60 coincident with the desired focusing plane. A plurality of horizontal guide rails 62 which are engaged in linear bearings 64 projecting from the walls 48 permit such reciprocal movement. In addition, reciprocal carriage motion is provided along the horizontal plane by utilizing a motor driven threaded shaft 66 which is threadingly engaged in at least one threaded aperture of a boss 68 projecting from one of the walls 48.

Vertical height adjustment of the carriage is permitted by a pair of opposed end plates 70. The end plates include vertically oriented linear bearings 72 which receive vertical guide rails 74. The height adjustment of the carriage is provided by at least one motor driven vertically oriented threaded shaft 76 which is engaged in a threaded aperture of a boss 78. The carriage 46 together with its associated motor drives and threaded shafts which provide reciprocal horizontal movement and vertical height adjustment function to sequentially stack successive sheets.

With reference now to FIGS. 2, 3 and 4, operation of the system will now become readily evident. Successive sheets 16 which are fan folded and joined to one another by easily separated bridging sections 80, (shown in FIG. 4), are engaged by the feed rollers 50 or, in lieu thereof, a suitable tractor feed. The guide 52 assures that the sheets 16 do not contact the heating element 54 which serves to soften the sheets for the purpose of accurately assuring that the upper surface of each top most sheet is at the appropriate reference plane and, in addition, to assure that each sheet is adequately bonded to its underlying sheet.

Each sheet is placed on the platen with the carriage being initially positioned to the far right end of the apparatus, as viewed from FIG. 2. The heating element causes the softened sheet to drape downwardly and contact the far right end of the underlying sheet of the stack or matrix 12. Thereafter, the carriage begins to translate toward the left, driven by the threaded shaft 66. The heat softened sheet 16 is initially engaged by the contact roller 58 which serves to commence bonding of the sheet to the underlying sheet. As the carriage moves further, the referencing roller 60 engages the upper surface of the sheet 16 and applies suitable pressure to assure bonding and to reference the upper surface of the sheet with the reference plane 25. The sheet 16 is separated from the remaining sheets being fed into the carriage by breaking the bridging sections. This may be accomplished by disengaging the feed rollers while maintaining movement of the carriage.

The carriage moves to the far left as viewed in FIG. 2 and away from the electron beam travel path. The electron gun 20 is thereafter actuated and the beam 18 traces the configuration of the article 14 at an incremental height which is coincident with the sheet 16 being irradiated. Thereafter, the process continues with the carriage being actuated to position the next successive sheet 16 of the matrix 12. Upon completion of the irradiation of all of the sheets necessary to form the article 14, the matrix is removed from the housing 36 and the matrix material separated by heat, pressure and/or solvents to reveal the completed article.

As will be observed from FIG. 1 wherein typical article configurations are illustrated in dash lines, articles 14 with undercuts may be easily formed and are supported by the solid matrix.

The platen 34 on which the matrix rests may be lowered in incremental steps so that the focal length of the electron beam remains constant throughout the process or, alternately, the platen may be fixed and the focal length of the electron beam 18 changed to accommodate each of the sheets 16 as the matrix is built up.

It should be appreciated that in portions of an article 14 where fine definition is not required, the incremental height of a single beam trace may be greater than in portions requiring fine definition. Accordingly, multiple supplies of sheets 16 may be employed with the sheets of each supply being of a different thickness or other characteristic to thus provide varying degrees of definition or other physical attributions in the article.

As previously mentioned, the sheets 16 of thermoplastic material which form the matrix are relatively thin, on the order of 0.0005 inch to 0.0200 inch. Since modern plastic film manufacture makes it difficult and economically unattractive to maintain tight tolerances on very thin sheets of materials, cumulative errors, within manufacturing tolerance levels, in a stack of possibly tens of thousands of sheets forming a matrix, may result in significant dimensional errors in the article.

In accordance with the invention, the problem of cumulative errors resulting from within tolerance variations in the manufacturing thickness of the sheets can be alleviated by constructing each sheet 16 as a laminate comprising a stratum 82 and a substratum 84. The substratum 84 serves to eliminate cumulative errors in the overall matrix height due to normal sheet tolerance by being easily plastically deformable under heat and/or pressure. As such, the substratum is deformed to assure that the upper surface of the sheet coincides with the reference plane 25.

In accordance with the invention, the stratum and substratum, constructed within their respective tolerance limits, will always have a combined thickness no less than the specified thickness of the sheet coincident with the incremental heighth of the article represented by such sheet. For example, if the sheet thickness required is 0.001 inch and the stratum thickness, within tolerance limits, ranges between 0.0008 inch plus or minus 0.0001 inch, a substratum having a minimum thickness of 0.0003 inch is necessary to ensure dimensional accuracy.

Figure 5:
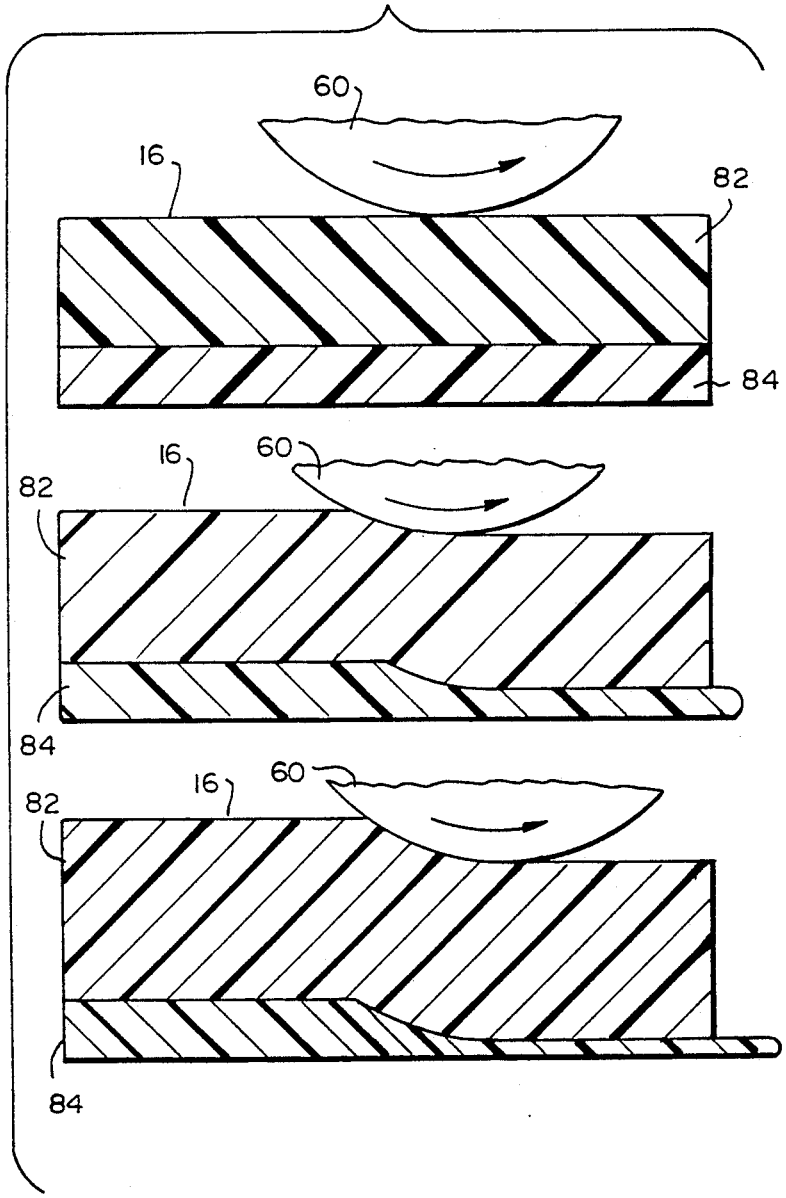
FIG. 5 comprises a series of greatly enlarged longitudinal sectional views through typical sheets showing a stratum and substratum of different thicknesses, all within tolerance limits and showing a roller of the carriage compressing the substratum to assure a uniform thickness of each sheet and reference the face of each sheet at an appropriate reference plane.
Figure 9:
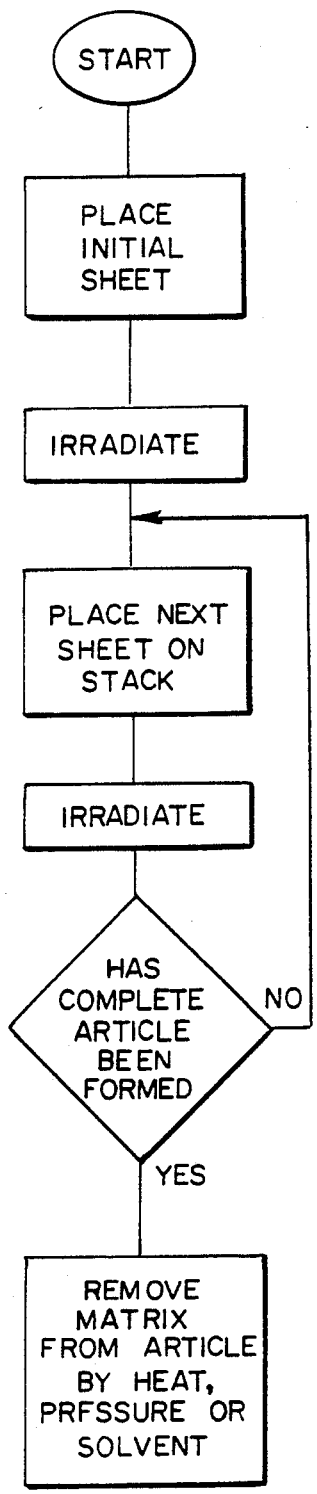
FIG. 9 is a flow chart illustrating the various steps of the method of shaping an article in accordance with the invention.

Referring now to the series of illustrations denoted as FIG. 5, the uppermost illustration comprises a greatly enlarged sectional view through a sheet 16 in contact with the referencing roller 60. The stratum 82 is at a thickness of 0.0007 inches, within its tolerance limit, and the substratum 84 is at its minimum thickness of 0.0003 inches. As such, the total combined thickness of the laminate sheet is exactly 0.001 inch, the desired thickness; hence, the referencing roller applies pressure which does not deform the sheet.

In the middle illustration, however, the stratum 82 is shown with a thickness of 0.0008 inches. As a result, the referencing roller 60, upon contacting the sheet 16, will deform the heated and softened substratum 84 until the upper surface of the sheet 16 lies within the reference plane.

In the lower illustration of FIG. 5, the stratum is shown with a thickness of 0.0009 inches. When the sheet 16 is contacted by the reference roller 60, the substratum 84 is deformed until the upper surface of the sheet 16 lies in the reference plane. In accordance with the invention, the substratum 84 thus provides a plastically deformable mass which is easily compressed to assure dimensional accuracy of the upper surface or face of the sheet being irradiated.

Figure 6:
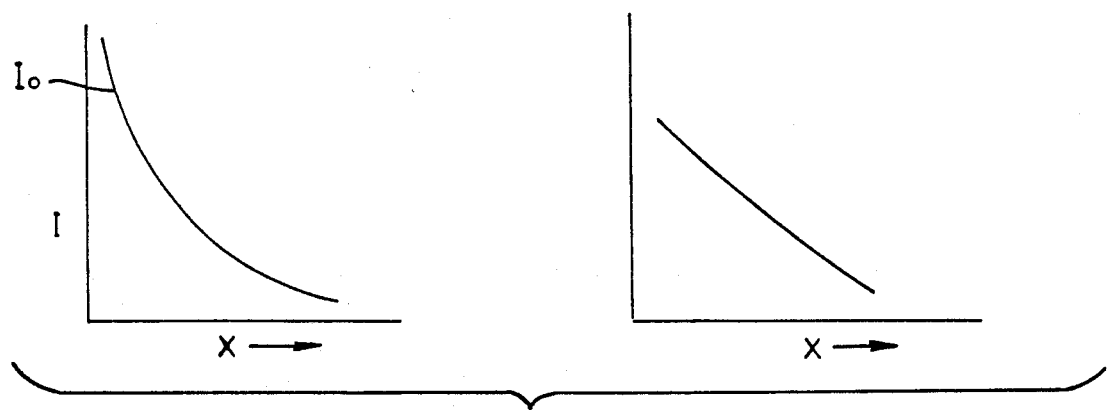
FIG. 6 comprises a graphic representations of beam intensity and relative diameter of cross-linking both as a function of the depth of penetration into a sheet of uniform cross-linking sensitivity.

A further problem relating to the dimensional accuracy and axial definition of an article being shaped is the phenomenon of beam intensity degradation resulting from penetration into each sheet. In the graph on the left of FIG. 6, beam intensity I verses depth of penetration x has been plotted. Absorption of the beam by the sheet 16 reduces intensity such that the intensity after passing through a layer of thickness x is equal to Io, the initial intensity, times the logarithmic constant e raised to the $-ax$ power represented by the following formula:

$$I = Ioe^{-ax}$$

where the quantity a is the linear absorption coefficient which is not a function of the material thickness. The graph on the right in FIG. 6 represents, as a function of the thickness x of the sheet, the relative diameter of the cross-linked sheet area. It will be appreciated that if a sheet 16 is formed of a material having uniform cross-linking sensitivity, the diameter of the cross-linked area decreases, practically on a linear basis, with depth of beam penetration.

Figure 7:
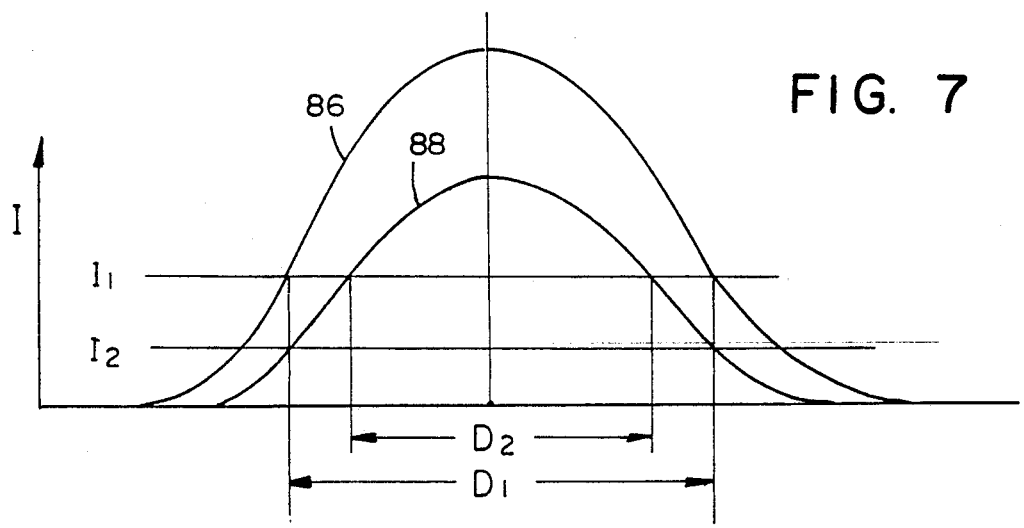
FIG. 7 is a graphic representation of beam intensity as a function of a tangential distance from the beam focal point, both at the face of a sheet and at a distance beneath the face.

In FIG. 7, a graphic representation of beam intensity plotted against tangential distance from the beam focal point is shown. The uppermost curve 86 represents beam intensity at, for example, the plane of the face of a sheet 16. The lower curve 88 represents beam intensity at a given depth x beneath the face. If an intensity level $I_1$ is required to effect cross-linking of the polymer mixture, the diameter of cross-linked area at the plane of the face of the sheet 16 is represented by the diameter $D_1$ while the diameter of cross-linked area at the depth x, within the sheet, is represented by $D_2$.

Pursuant to the invention, the illustrated reduction in the diameter of cross-linked material, as a result of reduced intensity, is compensated by formulating the substratum 84 with an increased amount of reactive diluent to thus increase cross-linking sensitivity. If the substratum sensitivity is adjusted such that a reduced intensity level $I_2$ is required to effect cross-linking, the diameter of the cross-linked area at the depth x will be represented by the distance $D_2$.

As a result, the effects of intensity degradation are greatly reduced and enhanced dimensional accuracy is achieved. It should be appreciated that multiple layers of substratum may be employed in a laminated sheet 16 such that there are multiple degrees of increased cross-linking sensitivity throughout the sheet 16, approaching a continuous sensitivity gradient.

An additional problem encountered when the sheets 16 are comprised of a polymer mixture of uniform cross-linking sensitivity is that when the electron beam has sufficient intensity to provide a cross-linked area of desired diameter at the bottom surface of a sheet 16, the intensity is such that the beam penetrates beneath the bottom of the uppermost sheet and commences undesired cross-linking of material in the underlying sheet, thus degrading axial resolution.

By providing one or more substratum with progressively increasing cross-linking sensitivity, the penetration of the reactive energy beam into an underlying sheet and cross-linking in the underlying sheet can be greatly reduced.

Figure 8:
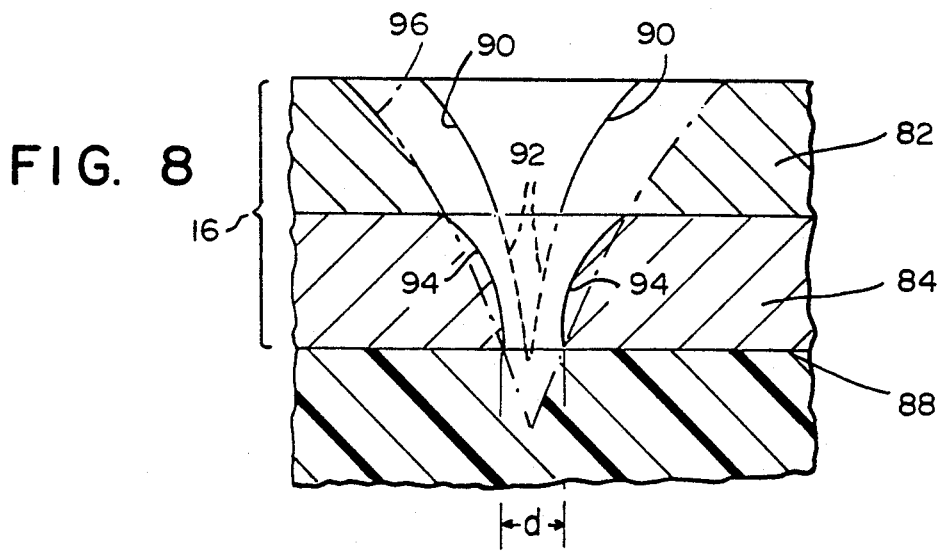
FIG. 8 is a greatly enlarged sectional view of a sheet comprising a stratum and substratum and an underlying sheet and showing, in solid lines, the cross-linking diameter profile with a substratum of increased cross-linking sensitivity and, in dashed lines, the cross-linking diameter profile with the substratum of the same sensitivity and further, in dot and dash lines, the cross-linking diameter profile necessary to provide a desired cross-linking diameter at the bottom of the sheet with the substratum of the same sensitivity.

Referring now to FIG. 8, the reference numerals 82 and 84 represent the stratum and substratum of an uppermost sheet being subject to irradiation while the reference numeral 88 represents the upper surface of an underlying sheet. With a beam impinging on the face of the stratum 82 a cross-linked diameter profile represented by the solid lines 90 is generated through the stratum 82. With the substratum 84 of the same sensitivity as the stratum 82, the diameter of cross-linked area in the substratum continues to decrease as shown by the dashed lines 92. If, on the other hand, the substratum 84 is formulated with increased cross-linking sensitivity, the diameter of cross-linked area in the substratum will be represented by the solid lines 94 and the diameter at the bottom of the sheet 16 will be represented by the distance d.

It should be appreciated that the stratum of the underlying layer commencing at the upper surface 88 is of the same cross-linking sensitivity as the stratum 82. As a result, the intensity level of the reactive energy beam is insufficient to cause significant penetration into the underlying sheet.

If the same cross-linked diameter d is desired at the bottom of a sheet 16 of uniform cross-linking sensitivity, the beam intensity level required would be significantly higher; as a result, the cross-linked diameter at the face of the stratum 82 would be significantly larger with the cross-linking diameters throughout the sheet 16 being represented by the dot and dash lines 96.

Further, the beam intensity level at the upper surface 88 of the underlying sheet would be such as to cause penetration into the underlying sheet and undesired cross-linking in the underlying sheet. By providing the substratum with increased cross-linking sensitivity, however, undesired cross-linking in the underlying sheet is prevented since the overall beam intensity level will be reduced.

While it was previously mentioned that the polymer mixture which comprises the sheets 16 include a base polymer resin, a reactive diluent and an initiator, the beam energy levels employed with an electron beam will generally be sufficient to permit self activation without the need of a separate initiator. Typically, initiators are employed in instances wherein the reactive energy beam is of lower energy value, such as at ultraviolet wavelengths.

It should also be noted that utilizing the matrix of the present invention, increased efficiencies will result not only from the ability to shape an article with multiple undercuts and fine cross-sections, but, in addition, since the articles 14 are supported inherently by the matrix, a plurality of articles may be formed alongside or "floating" on top of one another, resulting in a substantial savings in fabrication time.

Also, while the use of a transport carriage and roller has been illustrated for transporting, heating and referencing sheets which form the matrix, other apparatus may be employed for compiling sheets and assuring that the face of the sheet being irradiated lies at the appropriate reference plane.

Thus it will be seen that there is provided a matrix support article shaping system and method which achieves the various considerations, aspects and features of the present invention and which is well suited to meet the conditions of practical usage.

As various changes might be made in the matrix support article shaping system and method as above set forth, it is to be understood that all matter herein described or shown in the accompanying drawings is to be interpreted as illustrative and not in limiting sense.

I claim:

1. A system for forming the configuration of an article from a plurality of sheets of polymer material, the system comprising a layered plurality of unitary and cohesive sheets of dimensionally stable, self supporting, solid polymer material, the sheets of the layered plurality being in contact with adjacent sheets of the plurality, the polymer material including reactive means for effecting a change in the molecular structure of said polymer material in an area impinged by a reactive energy beam wherein the thickness of one of said sheets corresponds to an incremental height of said article, a storage station for storing the plurality of sheets, an impingement station for receiving a sheet corresponding to an incremental height of the article, means for transporting a sheet from the layered plurality at the storage station to the impingement station, the impingement station including at least one reference plane, the means for transporting including means for placing a face of the transported sheet substantially in the reference plane, means for tracing the configuration of said incremental heighth of the article on the placed sheet with a reactive energy beam, the placed sheet irradiated by said reactive energy beam having a molecular structure in the configuration of said incremental heighth of the article which is different from the molecular structure of the remainder of the placed sheet, the means for transporting being capable of sequentially transporting successive sheets of the plurality from the storage station to the impingement station and the means for placing being capable of placing a face of successive transported sheets substantially in a reference plane, the means for tracing being capable of tracing the configuration of a next sequential incremental heighth of the article on each of the sequentially place sheets and means for sequentially stacking successive sheets wherein the stacked sheets form a dimensionally stable matrix that supports the configuration of the article without lateral containment, and means for removing the configuration of the article from the matrix.

2. A system for forming the configuration of an article from a plurality of sheets as constructed in accordance with claim 1 wherein the polymer material comprises a thermoplastic polymer resin and a reactive diluent.

3. A system for forming the configuration of an article from a plurality of sheets as constructed in accordance with claim 2 wherein the polymer resin is selected from the group consisting of polyvinyl alcohol, polyethylene, phenoxy, and diallyl phthallate.

4. A system for forming the configuration of an article from a plurality of sheets as constructed in accordance with claim 2 wherein the reactive diluent is selected from the group consisting of dialdehyde, organic peroxide, diisocyanate, triazine and melamine.

5. A system for forming the configuration of an article from a plurality of sheets as constructed in accordance with claim 1 wherein the means for removing the configuration of the article from the matrix comprises means for heating the matrix.

6. A system for forming the configuration of an article from a plurality of sheets as constructed in accordance with claim 1 wherein the means for removing the configuration of the article from the matrix comprises means for applying pressure to the matrix.

7. A system for forming the configuration of an article from a plurality of sheets as constructed in accordance with claim 1 wherein the means for removing the configuration of the article from the matrix comprises a solvent.

8. A system forming the configuration of an article from a plurality of sheets as constructed in accordance with claim 1 wherein the reactive energy beam comprises an electron beam.

9. A system for forming the configuration of an article from a plurality of sheets as constructed in accordance with claim 1 wherein the means for placing a face of the transported sheet in the reference plane includes means for applying pressure against the upper surface of the sheet.

10. A system for forming the configuration of an article from a plurality of sheets as constructed in accordance with claim 9 further including heating means for softening the sheet so that the sheet is readily deformable under the applied pressure.

11. A system for forming the configuration of an article wherein a plurality of sheets as constructed in accordance with claim 9 wherein the means for applying pressure includes roller means.

12. A system for forming the configuration of an article from a plurality of sheets as constructed in accordance with claim 11 further including a carrier, means for moving the carrier in a direction parallel to the reference plane and means for moving the carrier in a direction transverse to the reference plane, and means mounting the roller means to the carrier.

13. A system for forming the configuration of an article from a plurality of sheets as constructed in accordance with claim 1 wherein at least one sheet comprises a laminate, the laminate comprising a stratum and a substratum, the substratum being more readily plastically deformable under heat and pressure than the stratum, the total thickness of the laminate being at least as great as the corresponding incremental heighth of the article, the system further including means for applying heat and pressure to said at least one sheet to deform the substratum.

14. A system for forming the configuration of an article from a plurality of sheets as constructed in accordance with claim 1 wherein the polymer material comprises a thermoplastic.

15. A system for forming the configuration of an article from a plurality of sheets as constructed in accordance with claim 1 wherein the polymer material comprises a thermoset.

16. A system for forming the configuration of an article from a plurality of sheets of polymer material as constructed in accordance with claim 1 wherein at least one sheet of the plurality of sheets of polymer material comprises a laminated sheet, the one sheet including a stratum formed of a polymer material and a substratum formed of a polymer material, the reactive energy beam being subject to absorption as a function of the depth of penetration into the sheet, the sheet including means for compensating for absorption of the reactive energy beam, the compensating means comprising means for increasing the sensitivity of the substratum polymer material to the reactive energy beam.

17. The system of claim 16 wherein the polymer materials of said one sheet each comprise a polymer resin and a reactive diluent, the means for increasing the sensitivity of the polymer material of the substratum comprising a higher proportion of reactive diluent in the substratum polymer material than in the stratum polymer material.

18. A system for forming the configuration of an article from a plurality of sheets of polymer material, the system comprising means for sequentially receiving a plurality of sheets of unitary self supporting dimensionally stable solid polymer material, each sheet corresponding to an incremental heighth of the article, means for generating a reactive energy beam, means for tracing the configuration of an incremental heighth of the article on an initial sheet with the reactive energy beam, each sheet including means for effecting a change in the molecular structure of the polymer material in an area impinged by the reactive energy beam, the means for tracing tracing the configuration of a next sequential incremental heighth of the article on additional sheets, the system further including means for forming a matrix comprising a stack of sequentially placed sheets upon each of which the reactive energy beam has been impinged, each of the sheets of the matrix having a molecular structure in the configuration of a corresponding incremental heighth of the article which is different from the molecular structure of the remainder of each sheet, each of the sheets of the matrix being in direct contact with adjacent sheets, the matrix supporting the configuration of the article without lateral containment and means for simultaneously removing the matrix from the article.

19. A method of forming the configuration of an article from a layered plurality of sheets of self supporting dimensionally stable, solid, polymer material, the method comprising the steps of:

(I) forming a matrix which supports the configuration of the article without lateral containment by
  (a) removing an initial sheet from the plurality;
  (b) placing the initial sheet within the range of a reactive energy beam;
  (c) irradiating the sheet by energizing and deflecting the beam to trace the configuration of an incremental planar heighth of the article on the sheet;
  (d) removing a next sequential sheet from the plurality;
  (e) irradiating the next sequential sheet by energizing and deflecting the beam to trace the configuration of the next sequential incremental planar heighth of the article on the next sequential sheet;
  (f) stacking the next sequential sheet over the previously irradiated sheet;
  (g) continuing to remove next sequential sheets from the plurality, irradiate the next sequential sheets and stack the next sequential sheets over previously irradiated sheets until the configuration of the article is built up from a stack of irradiated sheets which comprises the matrix; and thereafter (II) simultaneously removing from all the sheets which comprise the matrix, the portions of each sheet which do not comprise the configuration of the article by the application of heat to expose the article.

20. A method of forming an article in accordance with claim 19 wherein the reactive energy beam comprises an electron beam and the polymer material comprises a polymer resin and a reactive diluent, the steps of irradiating effecting a cross-linking of polymer material of the sheet registered with the traced configuration.

21. A method of forming an article in accordance with claim 19 wherein each sheet includes a face, the step of placing each sheet including the step of placing the face of each sheet in a reference plane, the reference plane being substantially perpendicular to the reactive energy beam and being at a distance equal to the focal length of the beam.

22. A method of forming an article in accordance with claim 21 wherein the step of placing the face of each sheet in the plane includes the step of adjusting the focal length of the reactive energy beam to coincide with the plane of the face.

23. A method of forming an article in accordance with claim 21 wherein the reference plane is fixed, the step of placing the face of each sheet in a plane coincident with the focal length of the reactive energy beam includes the step of lowering the sheets.

24. A method of forming an article in accordance with claim 21 wherein the step of placing the face of the sheet in the plane includes the step of reducing the thickness of the sheet.

25. A method of forming an article in accordance with claim 19 wherein the step of placing the next sequential sheet over the irradiated sheet takes place prior to the step of irradiating the next sequential sheet.

26. The method of claim 19 wherein step (II) comprises the application of heat and pressure to expose the article.

27. The method of claim 19 wherein step (II) comprises the application of heat, pressure, and solvent to expose the article.

28. A method of forming the configuration of an article from a layered plurality of sheets of self supporting dimensionally stable, solid, polymer material, the method comprising the steps of:

(I) forming a matrix which supports the configuration of the article without lateral containment by
  (a) removing an initial sheet from the plurality;
  (b) placing the initial sheet within the range of a reactive energy beam;
  (c) irradiating the sheet by energizing and deflecting the beam to trace the configuration of an incremental planar heighth of the article on the sheet;
  (d) removing a next sequential sheet from the plurality;
  (e) irradiating the next sequential sheet by energizing and deflecting the beam to trace the configuration of the next sequential incremental planar heighth of the article on the next sequential sheet;
  (f) stacking the next sequential sheet over the previously irradiated sheet;
  (g) continuing to remove next sequential sheets from the plurality, irradiate the next sequential sheets and stack the next sequential sheets over previously irradiated sheets until the configuration of the article is built up from a stack of irradiated sheets which comprises the matrix; and thereafter (II) simultaneously removing from all the sheets which comprise the matrix, the portions of each sheets which do not comprise the configuration of the article by the application of solvent to expose the article.

29. The method of claim 28 wherein step (II) comprises the application of solvent and pressure to expose the article.

30. The method of claim 28 wherein step (II) comprises the application of solvent and heat to expose the article.

* * * * *